United States Patent
Waayers et al.

(10) Patent No.: US 8,327,205 B2
(45) Date of Patent: Dec. 4, 2012

(54) IC TESTING METHODS AND APPARATUS

(75) Inventors: Tom Waayers, Sint Michielsgestel (NL); Johan C. Meirlevede, Doorwerth (NL); David P. Price, Totton (GB); Norbert Schomann, Rellingen (DE); Ruediger Solbach, Hamburg (DE); Hervé Fleury, Caen (FR); Jozef R. Poels, Beuningen (NL)

(73) Assignee: NXP B.V., Eindhoven (NL)

( * ) Notice: Subject to any disclaimer, the term of this patent is extended or adjusted under 35 U.S.C. 154(b) by 1173 days.

(21) Appl. No.: 12/160,211

(22) PCT Filed: Jan. 4, 2007

(86) PCT No.: PCT/IB2007/050025
§ 371 (c)(1),
(2), (4) Date: Jul. 18, 2008

(87) PCT Pub. No.: WO2007/077542
PCT Pub. Date: Jul. 12, 2007

(65) Prior Publication Data
US 2009/0003424 A1 Jan. 1, 2009

(30) Foreign Application Priority Data
Jan. 6, 2006 (EP) .................................. 06100139

(51) Int. Cl.
*G01R 31/28* (2006.01)
(52) U.S. Cl. .......................... 714/731; 714/727; 714/729
(58) Field of Classification Search .................. None
See application file for complete search history.

(56) References Cited

U.S. PATENT DOCUMENTS
6,418,545 B1 * 7/2002 Adusumilli ................... 714/729
(Continued)

FOREIGN PATENT DOCUMENTS
WO 03014756 A 2/2003

OTHER PUBLICATIONS
Bhavsar D, A method for synchronizing IEEE 1149.1 test access port for chip level testability access, Jan. 4, 1998, VLSI Design 1998, Proceedings., 1998 Eleventh International Conference on Chennai, India Jan. 4-7, 1998, Lost Alamitos, CA USA, IEEE Comput. Soc. US, pp. 289-292.

*Primary Examiner* — Guerrier Merant

(57) ABSTRACT

A method is provided for testing an integrated circuit comprising multiple cores, with at least two cores having different associated first and second clock signals of different frequencies. A test signal is provided using a clocked scan chain clocked at a test frequency (TCK). A transition is provided in a clock circuit reset signal (clockdiv_rst) which triggers the operation of a clock divider circuit (44) which derives the first and second clock signals (clk_xx, clk_yy, clk_zz) from an internal clock (40) of the integrated circuit. The first and second clock signals thus start at substantially the same time, and these are used during a test mode to perform a test of the integrated circuit. After test, the test result is output using the clocked scan chain clocked at the test frequency (TCK). Clocking hardware is also provided, and these provide at-speed testing which enables on the fly switching between a relatively slow tester driven clock for the shift modes and faster clocks generated by on-chip PLLs and divider circuits for the test mode.

19 Claims, 7 Drawing Sheets

U.S. PATENT DOCUMENTS

| | | | |
|---|---|---|---|
| 7,373,568 B1 * | 5/2008 | Horovitz | 714/726 |
| 7,444,567 B2 * | 10/2008 | Wang et al. | 714/726 |
| 7,721,170 B2 * | 5/2010 | Grise et al. | 714/726 |
| 2004/0003329 A1 * | 1/2004 | Cote et al. | 714/726 |
| 2005/0240847 A1 | 10/2005 | Nadeau-Dostie | |
| 2005/0276321 A1 | 12/2005 | Konuk | |
| 2007/0180341 A1 * | 8/2007 | Haroun et al. | 714/727 |
| 2011/0161757 A1 * | 6/2011 | Haroun et al. | 714/727 |

* cited by examiner

| Mode | seq_se | tck_en | tck_sel | clockdiv_rst |
|---|---|---|---|---|
| Application | 0 | 0 | 0 | 0 |
| Underlying core test (stuck@, Async, IDDq) | S | 1 | 1 | - |
| Interconnect test (stuck@, Async, IDDq) | S | 1 | 1 | - |
| Underlying core test (debug) (BIST, DelFT) | S | 1 | 1 | - |
| Underlying core test (@speed) (BIST, DelFT) | S | 1 | 0 | Shift: 1<br>Normal: 0 |
| CGU stuck@test | S | 1 | 1 | - |
| Debug<br>-run to breakpoint<br>-shift out | 0<br>1 | 0<br>1 | 0<br>1 | -<br>- |

FIG. 6

IC TESTING METHODS AND APPARATUS

The present invention generally relates to testing of semiconductor integrated circuits, and in particular relates to integrated circuits including integrated testing circuitry, such as BIST (built in self test) circuitry.

One common testing technique for the testing of semiconductor integrated circuits (ICs) is a scan testing technique. This essentially involves launching a test pattern (termed "vector") into the pins of a device package and monitoring an output response at a specific time, dependent on the clock speed of the device. A set of test vectors is used to enable the behaviour of the device under test to be determined. These vectors are designed to enable detection of manufacturing defects in the device.

An Automatic Test Pattern Generator (ATPG) is used to generate the vectors, and provide test patterns for stuck-at faults, transition faults and path delay faults. The testing of digital systems, such as the core logic of an integrated circuit, is typically performed by loading the test pattern into scannable memory elements in the system, launching the test data into the system, operating the system in normal mode for one or more clock cycles of the system clock, and capturing the response of the system to the test stimulus. The test response is extracted from the system and is compared with the response which should have been obtained if the system was operating according to design. The scanning of test patterns is carried out in so-called "shift cycles" whereas the system operation to test the system response is carried out in so-called "normal mode cycles".

To improve test coverage of individual circuits, DFT (Design for Test) tools have been developed to embed test circuitry into the System on Chip (SoC). For example, Built-In Self-Test (BIST) circuitry may be embedded in the IC design to test individual circuit blocks. Each core and sub-core embedded on a System on Chip includes its own test input and output ports and needs to be tested individually, without interference from adjacent cores. So-called wrapper cells are attached to the functional elements of a core to provide paths for the test data to flow. The test ports form part of the wrapper cell, which can operate in a transparent functional mode or in a test mode.

Scan testing is implemented by chaining several wrapper cells together in a chip register in order to scan test data in and out of the circuit.

It has been recognised that at-speed testing is desirable, particularly as a result of high speed delay fault and BIST testing. These speeds mean that the tester is no longer capable of providing the required speed/edge accuracy. An at-speed ("@speed") testing approach involves operating the core under test at the normal operating frequency, which will be significantly faster than the frequency with which signals are propagated along the scan chains. In this case, a test clock signal is used for the shift mode cycles, and internal PLL (phase locked loop) higher speed clock signals are used for the normal mode cycles.

Difficulties also arise in systems having multiple clock domains. For example, a System on Chip integrated circuit can include several digital modules having a variety of clocking domains and clock frequencies. Since the elements in one domain operate at a different frequency from that of other domains in the system, special provisions must be made during testing to ensure that signals traversing clock domains are synchronized. Otherwise, the test response from the system will not be repeatable and test results will be unreliable. The at-speed testing of multiple cores with different clock frequencies, which may all differ from the test clock frequency used for the shift mode cycles, presents particular timing problems, particularly arising from the unknown phase relationships between the system clocks. Multi-frequency designs would produce too many pattern sets if each frequency domain were tested one by one.

Hence, there is a need for a methodology and hardware that allows testing of multi frequency (including high frequency) domains in parallel. Indeed, multi Clock ATPG is considered as the most attractive Design for test (DfT) method to resolve clock domain interface problems during test.

According to the invention, there is provided a method of testing an integrated circuit comprising multiple cores, with at least two cores having different associated first and second clock signals of different frequencies, the method comprising:

during a first scan mode, providing a test signal to the circuit using a clocked scan chain clocked at a test frequency;

ending the first scan mode;

subsequently providing a transition in a clock circuit reset signal;

using the transition in the clock circuit reset signal to trigger the operation of a clock divider circuit which derives the first and second clock signals from an internal clock of the integrated circuit, such that the first and second clock signals start at substantially the same time;

during a test mode, performing a test of the integrated circuit with the at least two cores being clocked with timing derived from the first and second clock signals; and ending the test mode, and starting a second scan mode during which a result to the test signal is output using the clocked scan chain clocked at the test frequency.

This method provides at-speed testing and enables on the fly switching between a relatively slow tester driven clock for the shift modes and faster clocks generated by on-chip PLLs and divider circuits for the test mode.

In this way, the scan in and scan out is performed synchronous to the test system, while the test modes (which may be for delay fault testing or BIST memory testing) are performed with PLL generated clocks. The normal modes scale with the oscillator input frequency of the internal clock, while the scan in and out modes scale with the test clock frequency. Hence, the two frequencies (scan in/out and test mode) are decoupled and the test mode timing can be adjusted without affecting the scan operations.

The use of a clock circuit reset signal to trigger the operation of the clock divider circuit provides simultaneous launch of the internal divided clocks, which avoids glitches and provides correct clock operation.

The test may comprise a delay fault test. In this case, during the test mode, two clock cycles of the first and second clock signals are provided. The first and second clock signals can be controlled so that clock pulses are provided in either one or both of the two clock cycles. This control is selected based on the particular test pattern being used, and is implemented by clock control blocks.

The test mode is preferably ended with a further transition in the clock circuit reset signal.

The method may also be used for a BIST memory test. In this case, the first and second clock signals are provided continuously during the test mode. The test mode is again ended with a further transition in the in the clock circuit reset signal.

In either case, the first scan mode is preferably ended by a first transition in a scan enable line, and the second scan mode is started by a second transition in the scan enable line. The second transition is after the further transition in the clock circuit reset signal.

The operation of the clock divider circuit is preferably triggered by a transition of the internal clock of the integrated circuit after the transition in the clock circuit reset signal. Thus, the internal clock is used to time the simultaneous launch of divided clocks, and after the clock circuit reset signal transition.

In one example, the transition in the clock circuit reset signal is latched using the internal clock before being used to derive a divider reset signal to be applied to the clock divider. In this way, the clock circuit reset signal is synchronised to the internal clock to avoid stability problems before it is used to generate the actual divider reset signal for the clock divider circuit.

The operation of the clock divider circuit can be triggered by the next rising transition of the internal clock of the integrated circuit after the transition in the divider reset signal.

The invention also provides a circuit for generating clock signals and forming part of integrated circuit test circuitry, the circuit comprising:

a clock generation circuit;

a clock divider circuit for generating at least first and second clock signals of different frequencies from the output of the clock generation circuit; and a clock switching unit for switching between a test clock provided as an external input to the circuit and the at least first and second clock signals, wherein the clock switching unit comprises a reset input for receiving a signal to trigger the operation of the clock divider circuit, such that the first and second clock signals start at substantially the same time.

This circuit provides on-chip generated clock signals with simultaneous launch of the clock signals. These are particularly suitable for at-speed multiple core testing.

The at least first and second clock signals can each be provided to a respective clock control block for gating the clock signals so that selected clock pulses are provided, wherein the gated clock signals are provided as output of the circuit. The gating of the clock signals in this way enables delay fault tests to be implemented, for example in which two clock phases are used—one as a launch clock phase and one as a receive clock phase.

The clock switching unit may comprise a latching arrangement for latching the reset input using the internal clock of the clock generation circuit. This provides synchronisation of the signal to be used as the divider reset signal.

The clock switching unit may comprise a logic circuit for generating a divider reset signal which triggers the start of the generation of the at least first and second clock signals dependent on the timing of the reset input signal. The clock switching unit may comprise a multiplexer for switching between the test clock and the at least first and second clock signals, and the logic circuit then generates a control signal for the multiplexer.

The logic circuit enables the circuit to be operable in a plurality of modes, comprising an application mode, in which the circuit acts in transparent mode, a core test mode using the test clock, an interconnect mode using the test clock and an at-speed test mode using the internally generated clock signals. The at-speed test mode preferably enables both of a delay fault test mode and a BIST memory test mode to be implemented.

Examples of the invention will now be described in detail with reference to the accompanying drawings, in which:

FIG. 6 shows the different modes of operation of the circuit if FIG. 5;

The invention relates to the at-speed ("@speed") testing of an integrated circuit having multiple cores with different clock domains. In particular, the invention relates to delay fault testing and BIST testing. In delay fault testing, a signal transition is created (termed a launch event) and it is tested whether this transition arrives in time at a receiving element of the scan chain (termed a capture event). The main targets of this type of test are (resistive) open circuit type defects, which may result from contact errors, via errors, silicide cracks, etc.

It has been established that it can take a significant resistance before a defect significantly degrades a signal timing. Hence, to increase the effectiveness it is required that the device under test is tested at a sufficiently high frequency, and this is one of the reasons for at-speed testing.

In addition, the drive voltages used during test should be the maximum drive voltages, as active device (transistor) delays are then small and delays introduced by defects become relatively easier to detect. The temperature of the test should also be selected to optimise test conditions.

In order to provide at-speed testing, the system of the invention provides hardware that enables on the fly switching between a relatively slow tester driven clock for the shift modes and faster clocks generated by on-chip PLLs and divider circuits for the normal mode. Hence, the two frequencies (scan in/out and normal mode) are decoupled and the normal mode timing can be adjusted without affecting the scan operations.

In order to allow testing of circuits with multiple clock domains, the normal mode clocks are derived from one particular PLL master clock. This enables multiple frequency domains to be tested in parallel, as each domain is exercised at is appropriate frequency capability. Several clocks can be scaled proportionally to the required frequency test condition (by adjusting the oscillator-input frequency). The use on on-chip generated clocks also enables the internal frequencies to be increased far beyond the maximum capabilities of the test hardware. All high speed signalling can remain on chip, so that the testing is possible on low cost testers, without the need for a high-speed interface board, and consequently with less sensitivity to noise and contact resistance.

The test can be across clock domains with different cores having different clock domains interacting as part of the test procedure. This provides increased test coverage and quality. The use of at-speed testing uses as much as possible the same clock paths as in functional mode. This means that testing uses the same clock characteristics (duty cycle, propagation delay) as the functional/application mode, enhancing the coverage.

The method of the invention will first be described, followed by the testing hardware suitable for implementing the invention.

Figure 1:
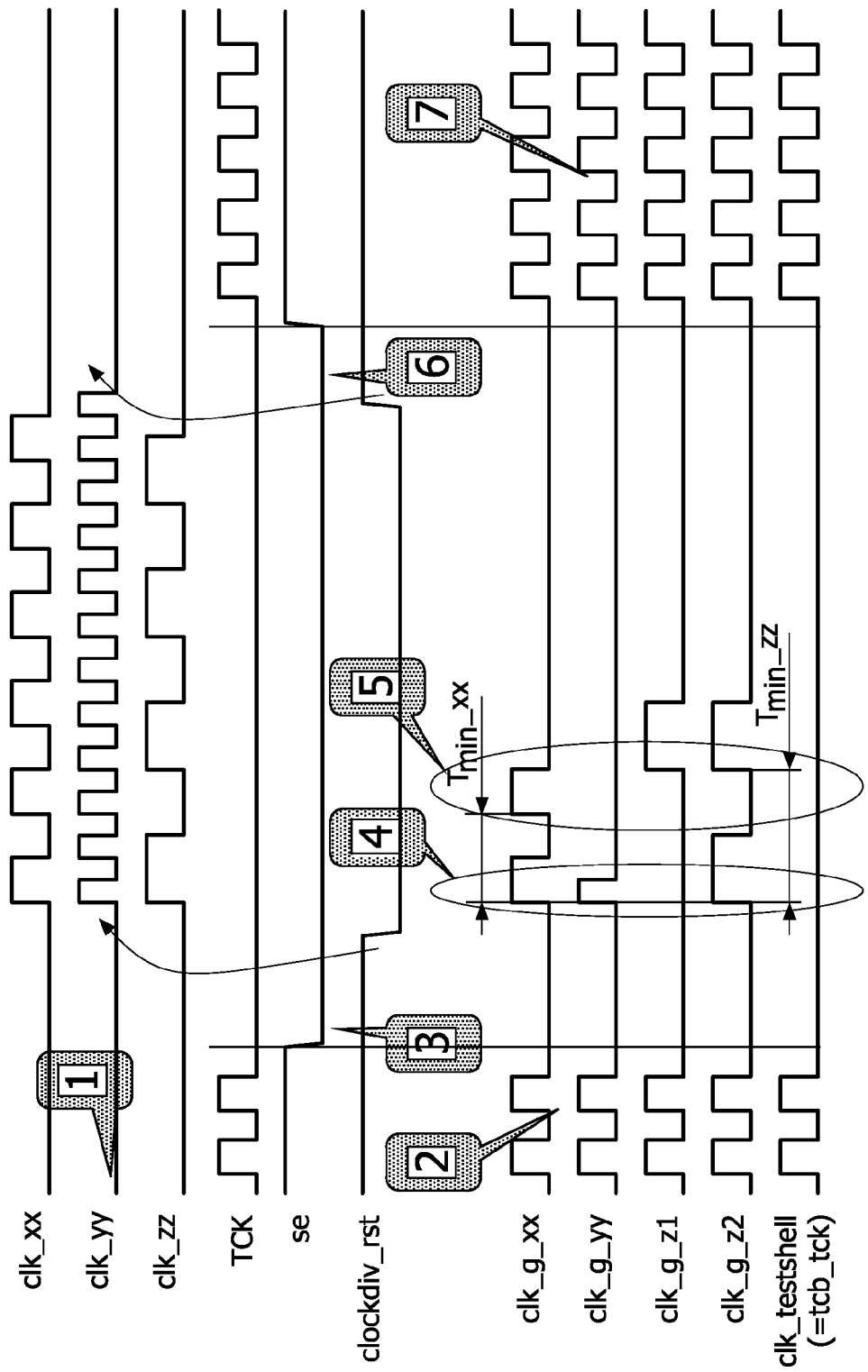
FIG. 1 shows the timing of a first example of implementation of the method of the invention.

FIG. 1 shows a timing diagram of one example of the test method of the invention, for a Delay Fault Test.

FIG. 1 shows the test clock TCK used for timing the shift mode cycles. The shift mode is active when a scan enable line "se" is high and the normal mode is active when the scan enable line is low. During the normal mode, three internal clock signals are generated in this example, each with different frequency, and these are shown as clk_xx, clk_yy and clk_zz. These are generated by PLL and divider circuits. During the normal mode, the test clock TCK is deactivated.

For the purpose of a delay fault test, individual phases of these clock signals are used to control the desired launch events. In particular, the normal mode uses two clock cycles. Clock Control Blocks (CCBs) generate from the clock signals clk_xx, clk_yy and clk_zz the desired clock phases.

In the example of FIG. 1, the CCBs generate the following clock signals which are used to provide one gating arrangement forming part of one test pattern:

clk_g_xx: This is a gated version of the clock signal clk_xx in which two clock phases are present.

clk_g_yy: This is a gated version of the clock signal clk_yy in which only the first clock phase is present.

clk_g_z1: This is a gated version of the clock signal clk_zz in which only the second clock phase is present.

clk_g_z2: This is a gated version of the clock signal clk_zz in which two clock phases are present.

The timing diagram additionally shows a reset signal clockdiv_rst used to control the timing of the gated clock signals, and this will be described further below.

The signal clk_testshell is a clock that controls test structures only, for example a BIST shell around a memory or an isolation layer between cores. The other clocks (other than TCK) are functional clocks, driving the functional elements of the design.

It can be seen that the timing scheme consists of three phases:

(i) A scan in phase (first shift mode) with line se high. This scan in phase also includes a PLL initialisation phase and control of the Test Control Block settings.

(ii) An execution phase (normal mode) with line se low. This is a delay fault test normal mode in this example, but it may instead be a BIST normal mode.

(iii) A scan out phase (second shift mode) with se high. This is a delay fault test scan out mode in this example, but it may instead be a BIST signature shift out mode.

Both the scan phases need to be synchronous to the tester, and are hence executed with the tester defined clock signal TCK.

The execution phase requires the multiple high-speed clock pulses and hence all clocks are switched to the internal clock generator circuits. During the execution phase, there is simultaneous launch of the gated clock signals, and unaligned capture.

The high frequency clocks (clk_xx, clk_yy and clk_zz in this example) are generated internally, avoiding the need for a costly, high speed tester and complicated board design. Each clock domain is exercised at its appropriate frequency. Thus, cores with multiple frequency domains can be tested in parallel without compromising the test effectiveness.

In the execution phase, the scan enable signal 'se' is used to switch the clocks from the test clock TCK to the internal outputs of the clock dividers used to generate the internal clocks.

A timing signal 'clockdiv_rst' is used to enable clock dividers, when the timing signal goes low, and this release clock pulses. Exactly two clock cycles are released, after which the clock control blocks (CCBs) gate the clocks. As shown, the CCBs can suppress either of the two clock pulses, and this enables skew-safe test patterns to be generated for multi-clock ATPG. The signal "clockdiv_rst" is made high to stop the clock dividers, and the signal 'se' can then return to high to switch the clocks back to the test clock TCK and return to shift mode.

This arrangement thus provides skew-safe at-speed inter clock domain testing, thus providing increased test coverage and quality. To achieve this, all clocks are released simultaneously, with exactly two cycles released on each clock. In combination with multi-clock ATPG, this guarantees that all launch events occur before any capture event, and hence interfaces between clock domains can be tested safely.

The different stages of the test process shown in FIG. 1 are now described in more detail, with reference to the timing portions numbered 1 to 7 in FIG. 1.

1. Test Setup

The at-speed delay fault testing involves more than the mere execution of a test vector. Before performing the test, the at-speed infrastructure needs to be set-up.

Prior to the test, a ring oscillator is tested and the oscillator input frequency is adjusted accordingly, to a previously established correlation between ring oscillator frequency and maximum test frequency for each core.

The Top level Test Control Block (TCB) is set to operate the internal Phase Locked Loops (PLLs) at the appropriate frequency. The PLLs are initialised and tested for lock. Once in lock, the user has to make sure that all subsequent vectors keep the oscillator input fully synchronous and that the PLL is not disturbed.

2. Scan In

Next the test vector can be started and the first vector is scanned in. During scan mode, all internal clocks are switched to follow the test clock pin TCK. Also during scan, the clock dividers are kept in reset by the signal clockdiv_rst.

3. Normal Mode Entry

At normal mode entry, the scannable flip flops (SFFs) in the core under test are switched to normal mode and the internal clocks are switched to the clock divider outputs during the zero phase of the test clock signal TCK. From this point onwards, the Clock Control Blocks (CCBs) control the release and gating of the clocks. This gating may be implemented in a Clock Generation Unit that contains the PLLs, dividers, clock switching elements and the CCBs.

The signal clockdiv_rst independently keeps the clock dividers in reset, so that clock switching during the zero phase of the test clock TCK is glitch free.

4. Launch Event

The launch is triggered by the transition of the clock divider reset signal clockdiv_rst. Due to the clock divider reset mechanism, all clocks in the subsystem will simultaneously start with a rising edge and trigger the launch event.

5. Capture Event

The PLL and divider generated clocks run at speed and a second clock cycle is released with the appropriate frequency. After this second clock cycle, the CCB sequencers suppress any further clock cycles.

6. Normal Mode Exit

After all capture events have been accomplished, the reset signal clockdiv_rst is brought high and internal clocks are gated to zero again. To accommodate the necessary time for capture, the normal mode may need to be stretched for a number of cycles.

7. Return to Shift Mode

The final step is to switch back to shift mode and the test clock TCK for tester synchronous shift out and shift in of the next pattern.

One key aspect of this mechanism is the aligned launch of the gated clock signals. With this approach, the normal mode clocks are derived from the functional clock dividers. Without some form of synchronization, the various clocks could have a random order. However, a main requirement of delay fault multiple clock domain testing (either by multi-clock ATPG or other), is that all launch events must have happened before any capture event.

This requirement stems from the known ATPG algorithms. The ATPG considers launch and capture as two independent events. It implies that multi-clock ATPG will calculate holding (or masking) of clock domain crossings independently for the launch and capture event. By launching in one clock domain and holding in (some) others, a safe launch can be made and likewise for the capture. If however the clock scheme places a launch clock after the capture clock of another domain, the latter capture can corrupt the launch without the appropriate masking by the ATPG.

Figure 2:
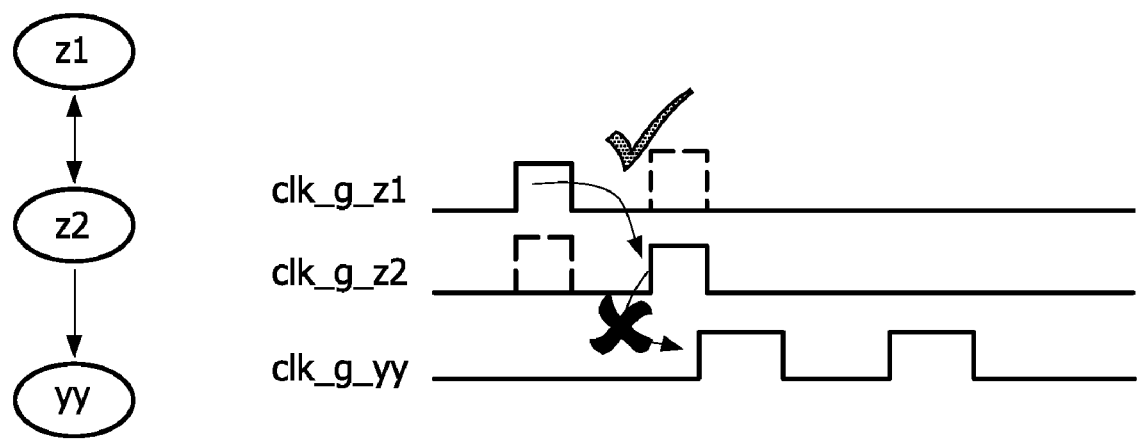
FIG. 2 is used to explain the benefit of the timing approach of FIG. 1.

This requirement is explained with reference to FIG. 2:

In this example, clock domain z1 interfaces to clock domain z2, while z2 also interfaces to domain yy. Multi-clock ATPG is applied to identify the interfaces and hold/mask appropriately.

The ATPG algorithm creates a pattern that exercises the interface between z1 and z2. z1 launches to z2 and the capture by z2 is made safe (the tick in FIG. 2) by gating the capture clock of z1 (dotted lines).

The launch pulse of z2 is gated. As z2 is capturing, the ATPG will also mask the data going from z2 to yy. However, the ATPG will only do this for the capture event and not for the launch event in yy (in ATPG terms, only the final vector data from z2 to yy is masked to X, and the initial vector data is considered valid as z2 is on hold during launch).

Domain yy is shown with a late launch, after the capture in domain z2 (shown by the cross). This cannot be identified and corrected by standard ATPG. For this reason, a launch synchronisation mechanism is required.

Thus, a predictable order of all launch and capture cycles is essential. The method of the invention provides all clocks launched simultaneously (but not necessarily skew free) but allows the capture clocks to become unaligned. Various clock domain interface techniques can then be used to cope with phase differences and/or different frequencies.

Figure 3:
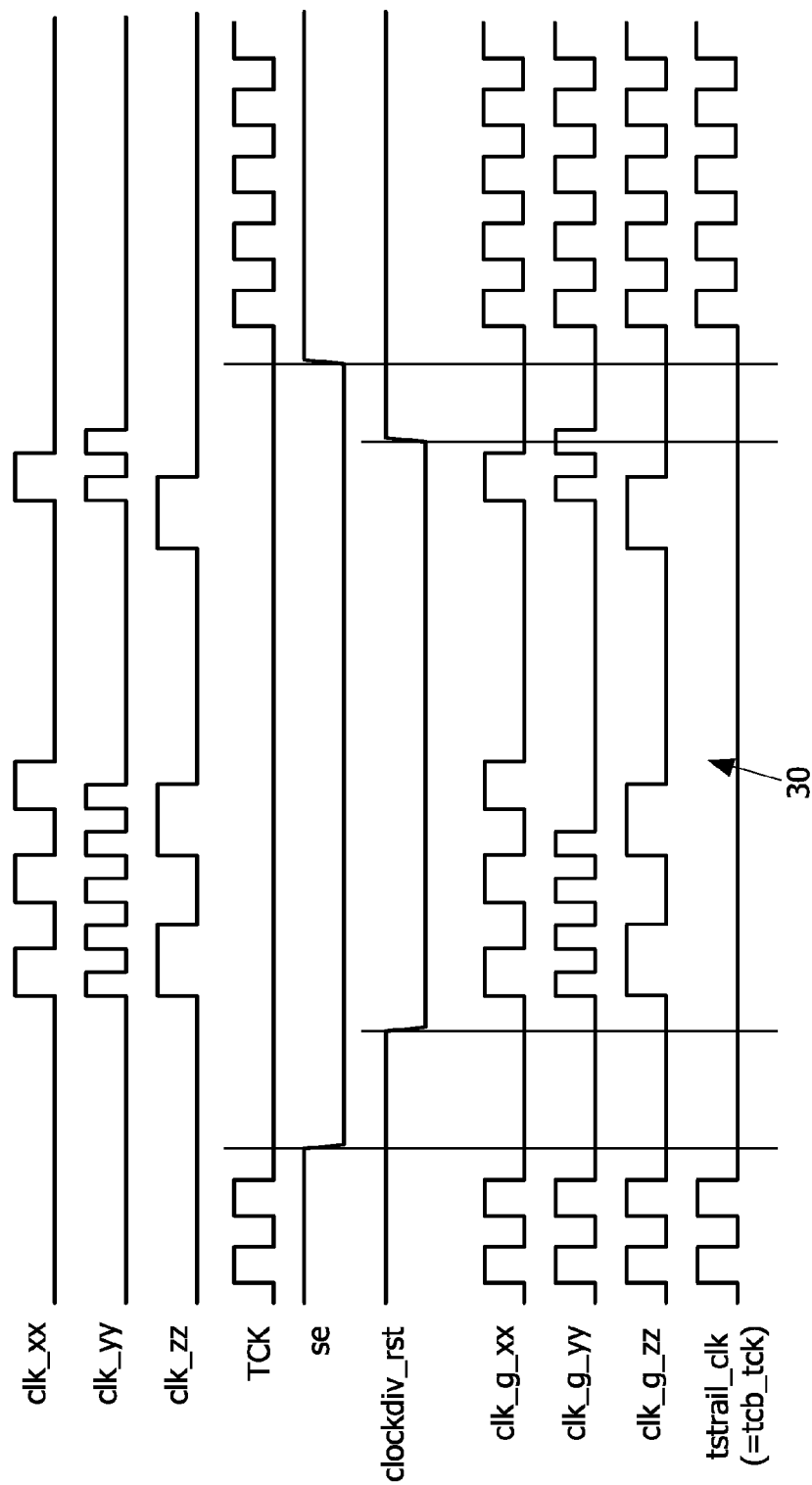
FIG. 3 shows the timing of a second example of implementation of the method of the invention.

The approach explained above can be applied to BIST memory testing, and FIG. 3 shows the BIST at-speed timing diagram.

This is essentially the same as FIG. 1, but an unrestricted amount of (fast) normal mode clock cycles are allowed in normal mode, as shown in region 30. This enables memories to be tested in parallel, but each one is tested at the appropriate frequency.

The clocking hardware will now be described with reference to FIG. 4. As will be apparent from the description above, there are various timing requirements which the hardware needs to enable:

It must be possible to initialise the PLL prior to the test (i.e. the normal mode) and maintain it locked during the test.

For glitch free switching between the tester clock pin (TCK) and the internal clocks, it is necessary to define a common clock phase during which the switch back and forth is made. To achieve this, while the signal clockdiv_rst is active (high), all clock dividers that generate clocks from a common PLL source are set to output a low level.

To enable robust multiple clock domain testing, all launch events happen before any capture event. To achieve this, when signal clockdiv_rst makes a transition to low, all clock dividers start with a rising edge.

To guarantee as much as possible the same timing conditions during test as during application mode, the clocks make use of the same application clock generator and clock paths. As no test specific clock generation is implemented, it implies that the effort of design and timing closure is reduced to the design of one generator.

A PLL circuit 40 provides a reference clock from a reference input 42. Clock divider circuits 44 generate the desired clock frequencies. A clock switch module 46 is inserted after the clock dividers 44 and provides the switching between the tester clock pin 48 (TCK) and the PLL-divider generated clocks. An auxiliary input pin 50 clockdiv_rst is used to control the switching independent of the scan enable "se" signal.

A gated derivative 52 of this signal (clockdiv_g_rst) is output to the clock dividers 44 and controls activation of the clocks.

After the switch block 46, clock control block (CCB) modules 54 are inserted at each clock output. These CCBs (at the clock generation unit level or, if available, at the chiplet level) control the number of clocks pulses released during normal mode. For example, one can be used for a stuck at test, and one can be used for a delay fault test, each of them can be gated.

The approach of adding a control block associated with the clock divider provides a generic approach and which enables a small number of timing critical signals. The use of clock signals which are not constantly running, but which are launched simultaneously provides a robust design which avoids skew/glitch problems.

Figure 4:
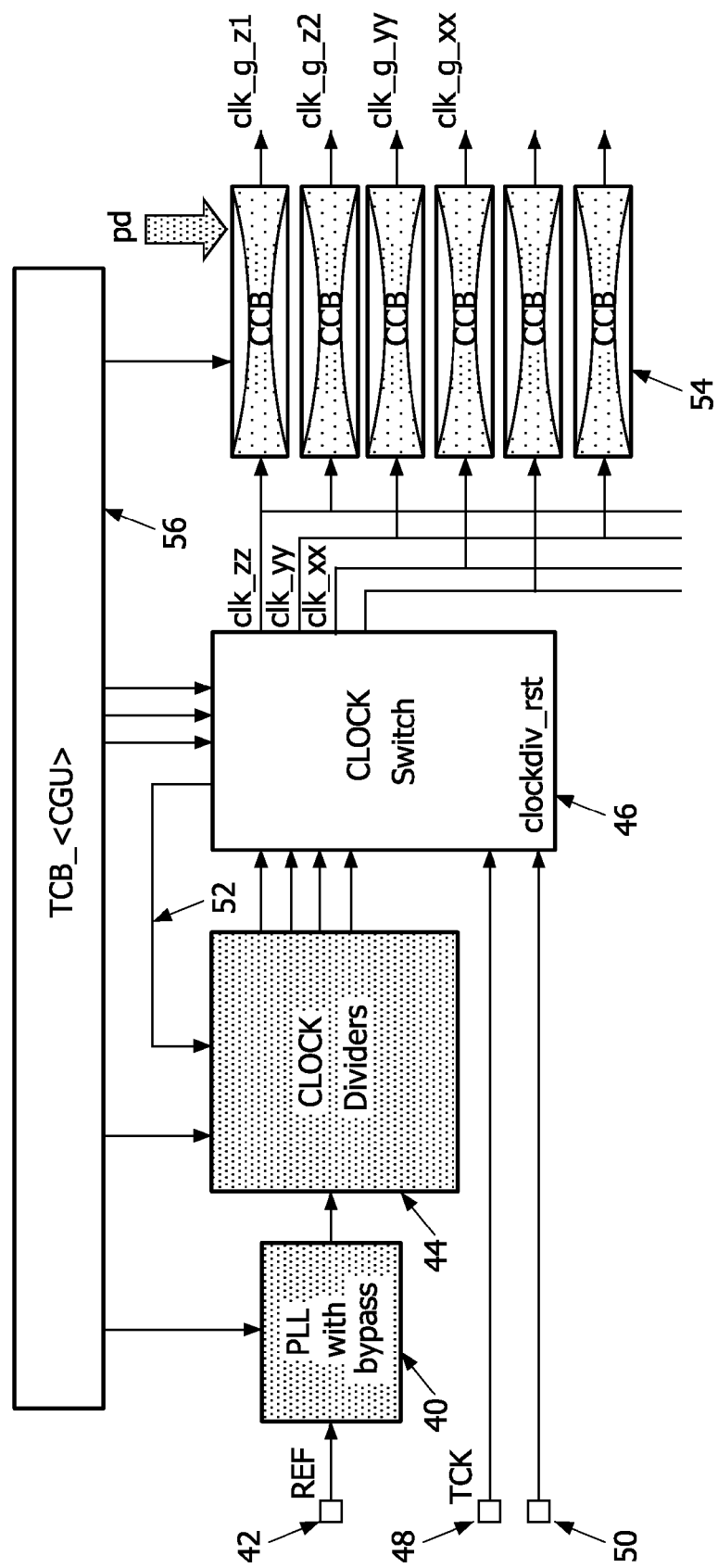
FIG. 4 shows the timing hardware to implement the different methods of the invention.

FIG. 4 also shows the test control block (TCB) 56. In FIG. 4, the TCB 56, the CCBs 54 and the clock switch 46 are functional components, and the PLL 40 and dividers 44 are test specific.

Figure 5:
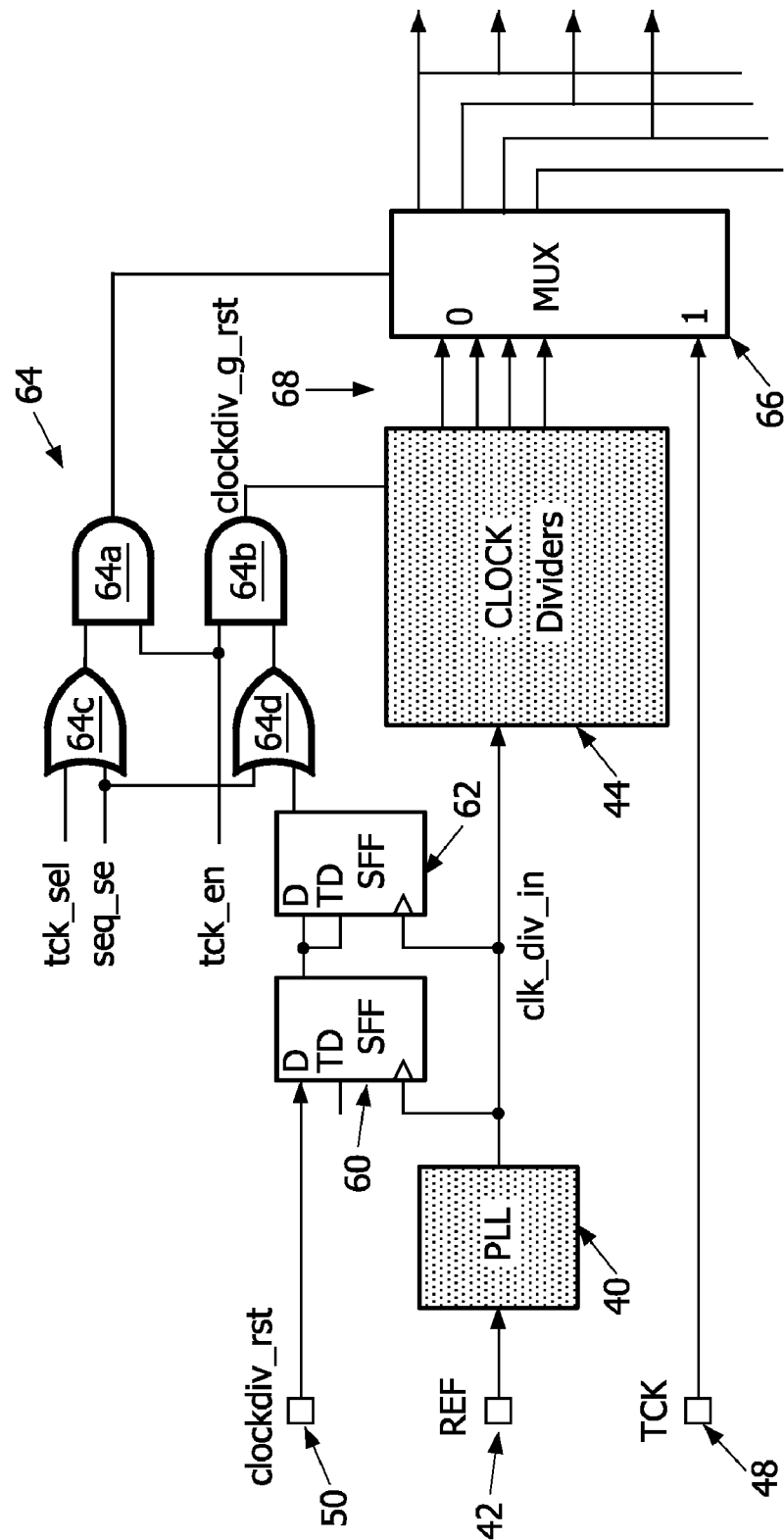
FIG. 5 shows the circuit of FIG. 4 in more detail.

The clock switch is shown in more detail in FIG. 5.

The signal from the pin clockdiv_rst is first synchronized to the PLL clock to avoid metastability problems, and this is achieved using the flip flops 60,62.

A logic gate arrangement 64 generates a control signal for the clock dividers in the form of a divider reset signal clockdiv_g_rst, and also provides a control signal for an output multiplexer 66 which either feeds the test clock TCK to the CCBs or else feeds the internally generated clocks 68 to the CCBs. The multiplexer function is thus a straightforward 2:1 multiplex of each clock divider output and the tester clock pin TCK.

If the clockdiv_rst signal is asserted, the clock dividers are (synchronously) reset to zero, allowing the switching between divider clocks and tester clock pin TCK. The signal is de-asserted in the normal mode at which moment it allows the at-speed clocks to run.

The function of the circuit is shown in the table of FIG. 6.

The logic 64 has three control inputs, as shown, and these are:

(i) tck_sel

This is a control line for selecting the test clock frequency for the testing operation (for conventional testing, with tck_sel=1) or for selecting the internally generated clock signals (for at-speed testing with tck_sel=0).

(ii) seq_se

This controls the clock divider and multiplexer depending on the scan enables line status, which represented as "S" in the table of FIG. 6.

(iii) tck_en

This functions as a general enable line, which must be high to enable the multiplexer to output the TCK test clock and must be high for the generation of the clock divider actuation pulse clockdiv_g_rst.

The logic 64 comprises a first AND gate 64a for generating the multiplexer control input, and this is high when tck_en is high and when one or both of tck_sel and seq_se are high. A second AND gate 64b generates the reset signal clockdiv_g_rst for the clock divider, and this reset signal goes low when a high-to-low transition on the input clockdiv_rst has propagated through the flip flops 60,62.

The OR gates 64c, 64d complete the functionality explained above, with one 64c providing an input to the AND gate 64a based on tck_sel OR seq_se, and the other 64d providing an OR function of the control line seq_se and the synchronised clockdiv_rst signal.

As can be seen from FIG. 6, the logic 64 enables a number of modes to be implemented.

The application mode has the clock circuitry disabled, with all three control lines low, so that the divider reset signal clockdiv_g-rst is low.

The hardware supports core test, interconnect test, debug test and stuck at testing, and for each of these modes, the multiplexer control line is high, so that the test clock TCK is output from the multiplexer. This is the result of tck_sel and tck_en both being high.

FIG. 6 also shows a shift out mode, with all control lines high, in which the multiplexer outputs the test clock TCK.

As shown in FIG. 6, the at-speed test has the control lines tck_en at 1 and tck_sel at 0. This means the multiplexer control depends on the value of S. When S=1, during the shift modes, the multiplexer is controlled to output the clock signal TCK. When S=0, during the normal mode, the multiplexer is controlled to output the internally generated clocks. Thus, the seq_se controls the clock multiplexer and enables the clockdiv_rst to enable or reset the clock dividers.

In addition, the clock dividers are only initiated by the control line clockdiv_rst 50. This has a transition from 1 during the shift mode to 0 for the start of the normal mode. This 1 to 0 transition initiates the start of the clock divider circuit operation, once the clockdiv_rst transition has been propagated to the clockdiv_g_rst clock divider input through the flip flops 60,62.

The pin clockdiv_rst can be still used as a scan input but has to be input high (some time) before the control signal seq_se goes low (and vice versa before normal mode exit).

Figure 7:
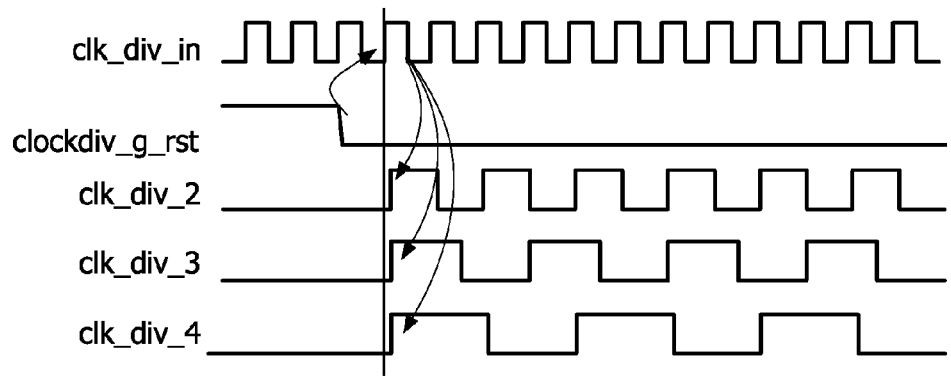
FIG. 7 is used to explain the timing at the beginning of the test mode using the circuit of FIG. 5.

The clock divider 44 has to provide a hold/reset function such that each divider starts with a launch edge. All clock outputs must be held low when the hold is active and must start with a rising edge once the hold goes inactive. This behaviour is shown in FIG. 7.

The signal clk_div_in is the PLL output, which is to be divided further to provide the divided clock outputs clk_div2, clk_div3, clk_div4, which correspond to the PLL clock divided by 2, 3 and 4.

As shown, the next rising edge of the PLL clock clk_div_in after the reset signal clockdiv_g_rst goes low triggers the start of the divided clocks.

At the end of the normal mode with the divided PLL clocks, the hold function is reasserted (when clockdiv_g_rst goes high), and all clock dividers have to be held/reset in the 0 clock phase. This is preferably done synchronously such that activating the reset does not create glitches, which could potentially corrupt data for example in the analyser of a BIST engine. As outlined above, for the delay fault test, the exact number of clocks is controlled by the CCBs, so stopping the clocks by clockdiv_g_rst is not critical.

Figure 8:
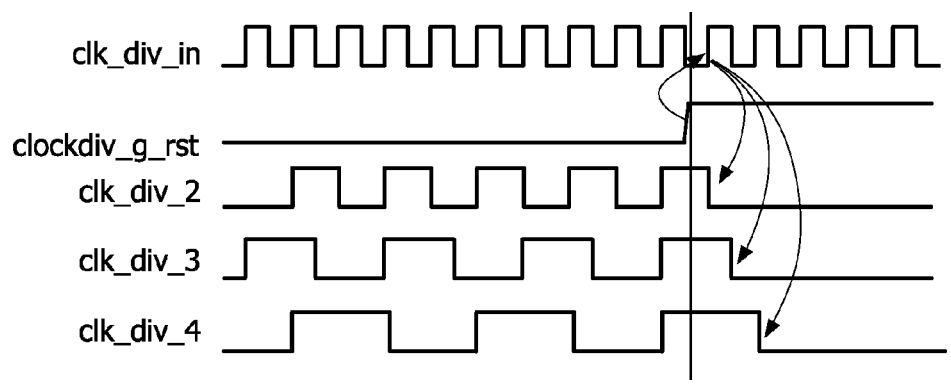
FIG. 8 is used to explain the timing at the end of the test mode using the circuit of FIG. 5.

For BIST—and in particular diagnosis—it is important that the clock is not a glitch as this could lead to clock uncertainty. The dividers are therefore required to provide waveforms as shown in FIG. 8. After the reset signal clockdiv_g_rst has returned high, the next rising edge of the PLL clock triggers the final transition to zero in the divided clocks.

During test modes, the divider is arranged so that only the test related reset signal is active. Any functional mode signal must be gated off or disabled.

In non-test modes the test related reset signal must be disabled. This can be done by a dedicated TCB signal. On the other hand, the test related reset signal should completely be disabled during functional mode. It must be ensured that the clock-system can properly start up in functional mode.

The clock control blocks which provide gating of the internal divided clock signals have not been described in detail, as these are conventional in the art.

Essentially the clock gating arrangement can comprise an AND gate, with one terminal receiving the clock signal to be gated and the other terminal receiving a control signal, which may be the output of a latch element having logic at its input, for example logic at the D input of a D type flip flop. Chiplet level gating may also be used, which is defined as gating inserted at the beginning of each clock tree in the shell of a chiplet or a core. Central gating (otherwise known an Clock Control Block control) is gating inserted at the root of the clock tree, in the top level clock generator unit, and before every outgoing clock, and the examples above assume the use of CCBs.

The different possible implementations of the gating function will be apparent to those skilled in the art. In the example above, the CCBs control the number of clocks being released in the normal mode, with 2 clock cycles for the delay fault test and multiple clock cycles for BIST. ATPG can also control the occurrence of a launch of capture event.

The use of various low to high and high to low transitions have been shown above, but of course these may be reversed.

Various other modifications will be apparent to those skilled in the art.

The invention claimed is:

1. A method of testing an integrated circuit comprising multiple cores, with at least two cores having different associated first and second clock signals of different frequencies, the method comprising:
   during a first scan mode, providing a test signal to the circuit using a clocked scan chain clocked at a test frequency;
   ending the first scan mode;
   subsequently providing a transition in a clock circuit reset signal;
   using the transition in the clock circuit reset signal to trigger the operation of a clock divider circuit which derives the first and second clock signals from an internal clock of the integrated circuit, such that the first and second clock signals start at substantially the same time;
   during a test mode, performing a test of the integrated circuit with the at least two cores being clocked with timing derived from the first and second clock signals; and
   ending the test mode, and starting a second scan mode during which a result to the test signal is output using the clocked scan chain clocked at the test frequency.

2. A method as claimed in claim 1, wherein the test comprises a delay fault test.

3. A method as claimed in claim 2, wherein during the test mode, two clock cycles of the first and second clock signals are provided.

4. A method as claimed in claim 3, wherein the first and second clock signals are controlled so that clock pulses are provided in either one or both of the two clock cycles.

5. A method as claimed in claim 1, wherein the test mode is ended with a further transition in the clock circuit reset signal.

6. A method as claimed in claim 1, wherein the test comprises a BIST memory test.

7. A method as claimed in claim 6, wherein the first and second clock signals are provided continuously during the test mode.

8. A method as claimed as claimed in claim 1, wherein the test mode is ended with a further transition in the in the clock circuit reset signal.

9. A method as claimed in claim 1, wherein the first scan mode is ended by a first transition in a scan enable line, and wherein the second scan mode is started by a second transition in the scan enable line, the second transition being after the further transition in the clock circuit reset signal.

10. A method as claimed in claim 1, wherein the operation of the clock divider circuit is triggered by a transition of the internal clock of the integrated circuit after the transition in the clock circuit reset signal.

11. A method as claimed in claim 10, wherein the transition in the clock circuit reset signal is latched using the internal clock before being used to derive a divider reset signal to be applied to the clock divider.

12. A method as claimed in claim 11, wherein the operation of the clock divider circuit is triggered by the next rising transition of the internal clock of the integrated circuit after the transition in the divider reset signal.

13. A circuit for generating clock signals and forming part of integrated circuit test circuitry, the circuit comprising:
   a clock generation circuit;
   a clock divider circuit for generating at least first and second clock signals of different frequencies from the output of the clock generation circuit; and
   a clock switching unit for switching between a test clock provided as an external input to the circuit and the at least first and second clock signals,
   wherein the clock switching unit comprises a reset input for receiving a signal to trigger the operation of the clock divider circuit, such that the first and second clock signals start at substantially the same time.

14. A circuit as claimed in claim 13, wherein the at least first and second clock signals are each provided to a respective clock control block for gating the clock signals so that selected clock pulses are provided, wherein the gated clock signals are provided as output of the circuit.

15. A circuit as claimed in claim 13, wherein the clock switching unit comprises a latching arrangement for latching the reset input using the internal clock of the clock generation circuit.

16. A circuit as claimed in claim 13 wherein the clock switching unit comprises a logic circuit for generating a divider reset signal which triggers the start of the generation of the at least first and second clock signals dependent on the timing of the reset input signal.

17. A circuit as claimed in claim 16 wherein the clock switching unit comprises a multiplexer for switching between the test clock and the at least first and second clock signals, and wherein the logic circuit generates a control signal for the multiplexer.

18. A as claimed in claim 13, operable in a plurality of modes, comprising an application mode, in which the circuit acts in transparent mode, a core test mode using the test clock, an interconnect mode using the test clock and an at-speed test mode using the internally generated clock signals.

19. A circuit as claimed in claim 18, wherein the at-speed test mode comprises a delay fault test mode or a BIST memory test mode.

* * * * *